US009478316B1

(12) United States Patent
Ryu

(10) Patent No.: US 9,478,316 B1
(45) Date of Patent: Oct. 25, 2016

(54) MEMORY DEVICE

(71) Applicant: SK hynix Inc., Gyeonggi-do (KR)

(72) Inventor: Hoon Ryu, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/991,501

(22) Filed: Jan. 8, 2016

(51) Int. Cl.
G11C 29/00 (2006.01)
G11C 11/406 (2006.01)
G11C 11/408 (2006.01)

(52) U.S. Cl.
CPC ............ *G11C 29/76* (2013.01); *G11C 11/406* (2013.01); *G11C 11/408* (2013.01)

(58) Field of Classification Search
CPC ...... G11C 29/783; G11C 8/08; G11C 11/408
See application file for complete search history.

(56) References Cited

U.S. PATENT DOCUMENTS

| 5,255,234 | A * | 10/1993 | Seok ............... G11C 29/808 365/200 |
| 8,072,827 | B2 * | 12/2011 | Wakimoto ......... G11C 11/406 365/200 |
| 2009/0021999 | A1 * | 1/2009 | Tanimura ........... G11C 7/222 365/200 |
| 2013/0268727 | A1 * | 10/2013 | Sohn ................... G11C 8/00 711/105 |
| 2014/0063995 | A1 * | 3/2014 | Song .................. G11C 8/14 365/200 |
| 2014/0177376 | A1 * | 6/2014 | Song ................. G11C 29/783 365/230.03 |
| 2015/0049567 | A1 * | 2/2015 | Chi .................... G11C 7/02 365/222 |
| 2015/0170728 | A1 * | 6/2015 | Jung ................. G11C 8/08 365/222 |

FOREIGN PATENT DOCUMENTS

| KR | 1020140029018 | 3/2014 |
| KR | 1020140070303 | 6/2014 |
| KR | 1020150071371 | 6/2015 |

* cited by examiner

*Primary Examiner* — Tuan T Nguyen
(74) *Attorney, Agent, or Firm* — IP & T Group LLP

(57) ABSTRACT

A memory device may include a plurality of normal word lines; a plurality of redundancy word lines capable of replacing the word lines; a hammering information storage unit capable of storing an address of a row hammering word line of the normal word lines and the redundancy word lines; an address generation unit capable of generating an address of a normal word line or redundancy word line adjacent to a normal word line or redundancy word line corresponding to the address stored in the hammering information storage unit; and a refresh control unit capable of selecting the normal word line or redundancy word line corresponding to the address generated by the address generation unit for performing an additional refresh operation.

19 Claims, 5 Drawing Sheets

(PRIOT ART)

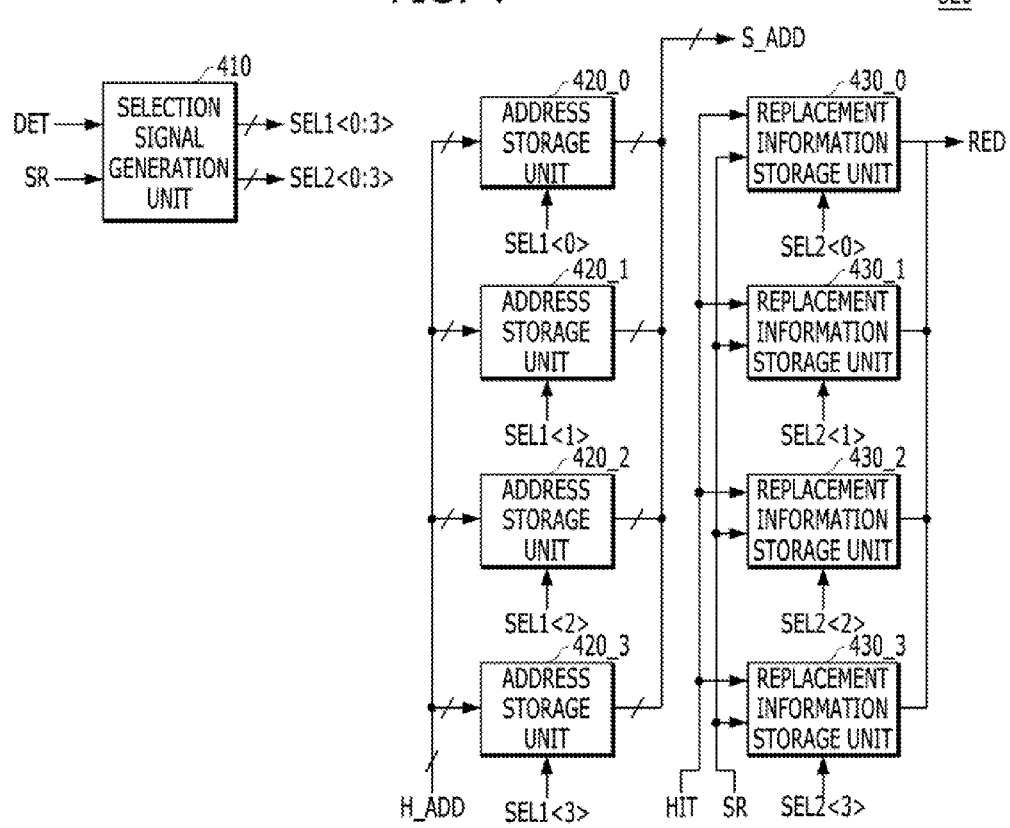
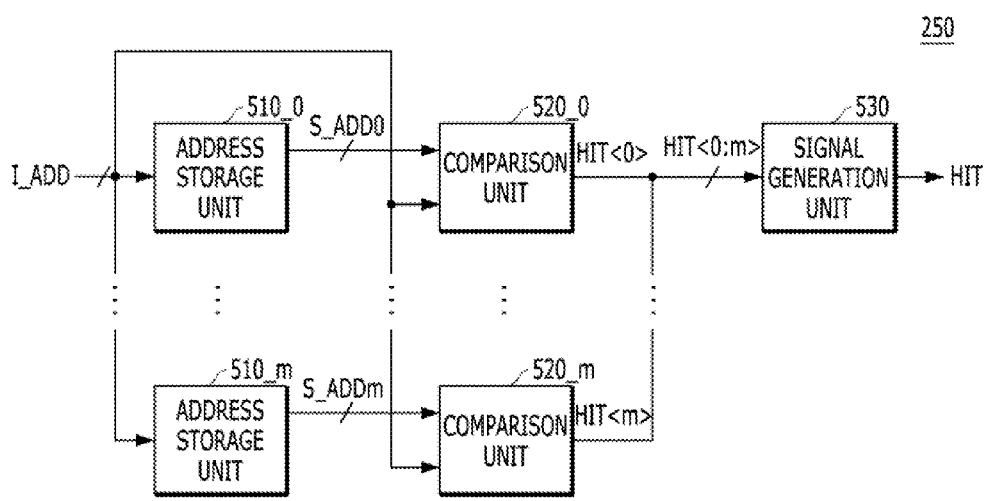

MEMORY DEVICE

BACKGROUND

1. Field

Exemplary embodiments of the present invention relate to a memory device.

2. Description of the Related Art

Memory devices have a plurality of memory cells for storing data. Each memory cell may include a MOS transistor functioning as a switch and a capacitor for storing a charge representing data stored in the memory cell. For example, a charge stored in a capacitor may represent a '1' or a '0' in a binary logic system depending upon whether the stored charge is high or low.

Ideally, no consumption of power is needed to retain data stored in a memory cell. However, in practice, the stored data may not be retained for a long time period because a charge initially stored in a capacitor of a memory cell may be lost due to a leakage current occurring at the PN junction of a MOS transistor. Before stored data is lost, for preventing data loss, stored data are read and the charges corresponding to the read data are recharged into the memory cells. Such a process is known as a refresh operation and is typically repeated periodically for maintaining the integrity of stored data.

FIG. 1 is a diagram showing part of a cell array included in a memory device. In FIG. 1, "BL" denotes a bit line.

In the cell array of FIG. 1, WLK−1, WLK (HIGH_ACT), and WLK+1 denote three word lines disposed in parallel to one another. The word line WLK(HIGH_ACT) is a word line having a larger activation number or higher activation frequency than the other word lines. The word line WLK−1 and the word line WLK+1 are disposed adjacent on either side of the word line WLK. CELL_K−1, CELL_K, and CELL_K+1 are memory cells coupled to the word lines WLK−1, WLK (HIGH_ACT), and WLK+1, respectively. The memory cells CELL_K−1, CELL_K, and CELL_K+1 include respective cell transistors TR_K−1, TR_K, and TR_K+1 and respective cell capacitors CAP_K−1, CAP_K, and CAP_K+1.

In FIG. 1, when the word line WLK (HIGH_ACT) is activated or precharged (or deactivated), the voltages of the word line WLK−1 and the word line WLK+1 may rise and fall due to a coupling phenomenon generated between the word line WLK (HIGH_ACT) and each of the word lines WLK−1 and WLK+1, which also affects the charges stored in their respective cell capacitors CAP_K−1 and CAP_K+1. Accordingly, if the word line WLK (HIGH_ACT) is activated and precharged frequently, that is, if the word line WLK (HIGH_ACT) is toggled in the active, precharge state, data stored in the cell capacitors CELL_K−1 and CELL_K+1 may be damaged due to a change in the charges stored in the cell capacitors CAP_K−1 and CAP_K+1. This is often referred to as a row hammer phenomenon.

Furthermore, the data of the memory cells may be damaged due to electromagnetic waves generated when the word line WLK (HIGH_ACT) is toggled in the active, precharge state which may drain electrons from the cell capacitors CAP_K−1 and CAP_K+1.

SUMMARY

Various embodiments are directed to a memory device capable of preventing the data of memory cells from being damaged by additionally refreshing a normal word line adjacent to a row hammering word line.

In addition, various embodiments are directed to a memory device capable of preventing the data of memory cells from being damaged by additionally refreshing an adjacent redundancy word line if a row hammering word line is a redundancy word line.

In an embodiment, a memory device may include a plurality of normal word lines; a plurality of redundancy word lines capable of replacing the word lines; a hammering information storage unit capable of storing an address of a row hammering word line of the normal word lines and the redundancy word lines; an address generation unit capable of generating an address of a normal word line or redundancy word line adjacent to a normal word line or redundancy word line corresponding to the address stored in the hammering information storage unit; and a refresh control unit capable of selecting the normal word line or redundancy word line corresponding to the address generated by the address generation unit for performing an additional refresh operation.

In an embodiment, a memory device may include a plurality of normal word lines; a plurality of redundancy word lines capable of replacing the word lines; a hammering address generation unit capable of storing an address of a row hammering word line of the normal word lines and the redundancy word lines and replacement information indicative of whether the row hammering word line is a normal word line or a redundancy word line, and generating an address of a normal word line or redundancy word line adjacent to the row hammering word line; a redundancy selection unit capable of controlling the redundancy word line corresponding to the address generated by the hammering address generation unit to be selected from the redundancy word lines when the replacement information indicates that the row hammering word line is the redundancy word line; and a refresh control unit capable of controlling the normal word line or redundancy word line corresponding to the address generated by the hammering address generation unit to be additionally refreshed.

In an embodiment, a memory device may include a plurality of normal word lines; a plurality of redundancy groups each comprising one or more redundancy word lines for replacing the word lines; a first hammering information storage unit capable of storing an address of a row hammering word line of the normal word lines; a first address generation unit capable of generating an address of a normal word line adjacent to a normal word line corresponding to the address stored in the first hammering information storage unit; a plurality of second hammering information storage units each capable of storing an address of a row hammering word line of the redundancy word lines of each of the redundancy groups; a plurality of second address generation units each capable of generating an address of a redundancy word line adjacent to a redundancy word line corresponding to the address stored in each of the second hammering information storage units; and a refresh control unit capable of controlling a normal word line corresponding to the address generated by the first address generation unit or a redundancy word line corresponding to the address generated by the second address generation unit to be additionally refreshed.

BRIEF DESCRIPTION OF THE DRAWINGS

FIG. 4 is a detailed diagram of an example of a hammering information storage unit shown in FIG. 3.

FIG. 5 is a detailed diagram of an example of a redundancy control unit shown in FIG. 2.

DETAILED DESCRIPTION

Figure 1:
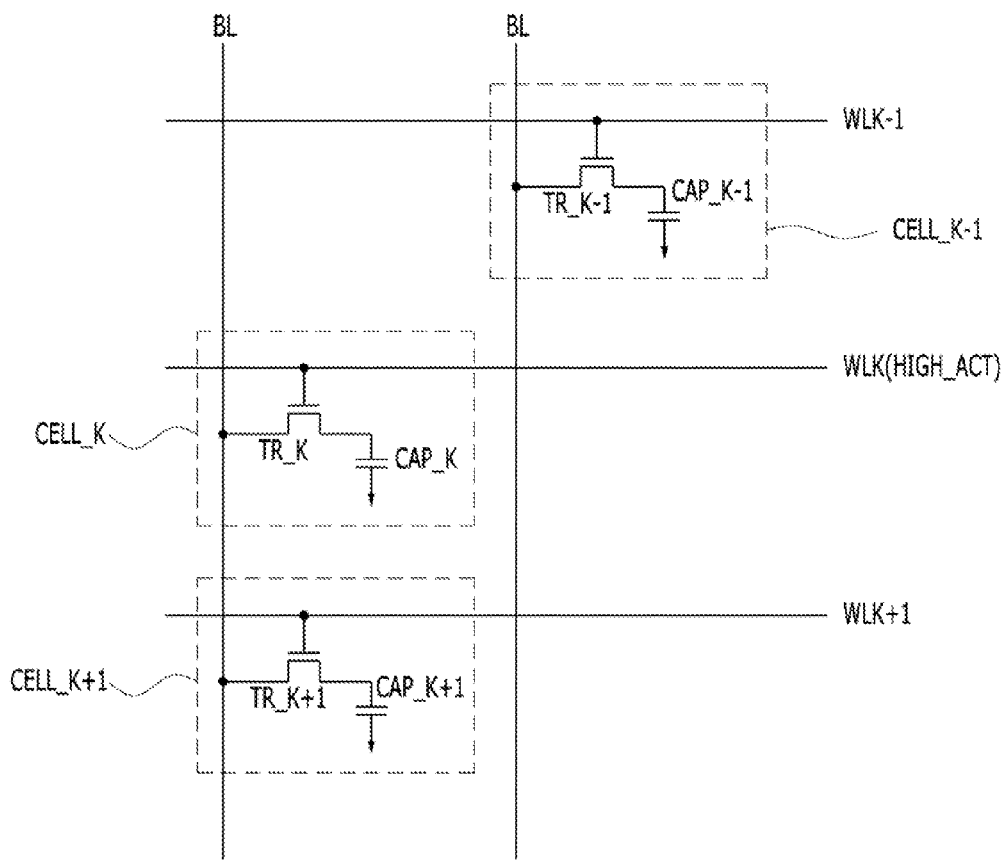
FIG. 1 is a diagram showing part of a conventional cell array included in a memory device.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete to those skilled in the art to which this invention pertains. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component.

Hereinafter, a row hammering word line may be indicative of a normal word line or a redundancy word line having an activation number equal or greater than a reference number or having a frequency equal or greater than a reference frequency. A hammering address may be indicative of the address of a row hammering word line. Accordingly, if a row hammering word line is a normal word line, a hammering address may be the address of a corresponding word line. If a row hammering word line is a redundancy word line, a hammering address may be the address a corresponding redundancy word line.

Figure 2:
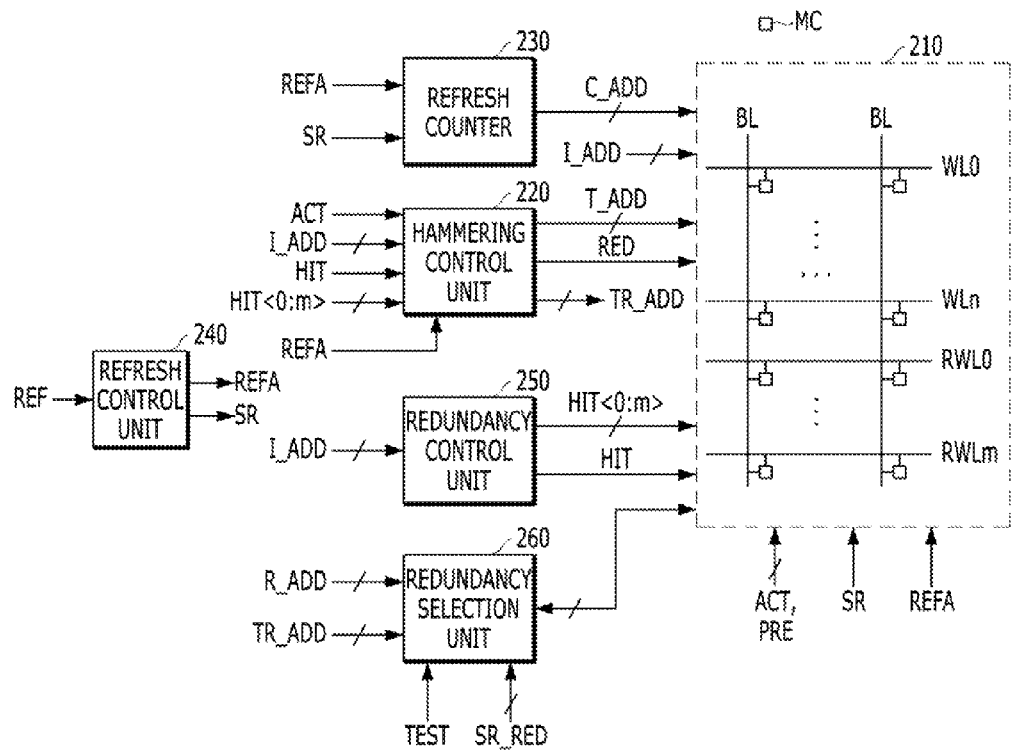
FIG. 2 is a block diagram illustrating a memory device, according to an embodiment of the present invention.

Referring now to FIG. 2 a memory device according to an embodiment of the present invention. The memory device may include a cell array 210, a hammering control unit 220, a refresh counter 230, a refresh control unit 240, a redundancy control unit 250, and a redundancy selection unit 260.

The cell array 210 may include a plurality of word lines WL0 to WLn, redundancy word lines RWL0 to RWLm for replacing defective word lines of the word lines, a plurality of bit lines BL, and a plurality of memory cells MC.

The hammering control unit 220 may detect a row hammering word line and store a corresponding hammering address. The hammering control unit 220 may detect a normal word line or redundancy word line which satisfies a first and/or a second condition, as a row hammering word line. The first condition may be the normal word line or redundancy word line having an activation number equal or greater than a reference number. The second condition may be the normal word line or redundancy word line having a frequency equal or greater than a reference frequency. For example, the reference frequency may be represented by the ratio of the activation number of a specific word line to the total number of active operations performed in the memory device during a specific time period. The activation number of a specific word line may be the number of times the specific word line has been activated. For example, if the reference frequency is 2/5, this may mean that a specific word line is activated twice while an active operation is performed five times.

The hammering control unit 220 may detect a row hammering word line based on the number of times an input address I_ADD corresponding to an active signal ACT has been inputted. An Input address I_ADD may be activated every time an active operation of the memory device is performed. For example, the activation number of a specific word line or the activation frequency of the specific word line may be detected by counting the number of inputs of the address I_ADD corresponding to the specific word line when the active signal ACT is activated. In this case, if the detected specific word line has been substituted with a redundancy word line, the redundancy word line may become a row hammering word line.

The hammering control unit 220 may store the address I_ADD, corresponding to a word line, as a hammering address H_ADD if a row hammering word line is the word line. The hammering control unit 220 may store an address R_ADD, corresponding to a redundancy word line, and the address I_ADD of a word line substituted by a row hammering word line if the row hammering word line is the redundancy word line.

Furthermore, the hammering control unit 220 may store replacement information RED indicative of whether a row hammering word line is a normal word line or a redundancy word line. For such an operation, when detecting a row hammering word line, the hammering control unit 220 may store a corresponding address I_ADD, a hit signal HIT indicative of whether an operation is a repair operation as replacement information RED along with the corresponding address I_ADD and an address R_ADD corresponding to a redundancy word line activated when the hit signal HIT is activated.

The hammering control unit 220 may generate the address of a normal word line or redundancy word line adjacent to a row hammering word line using an address stored in the section in which a supplemental refresh is performed and output the generated address. If a row hammering word line is found to be a word line based on replacement information RED, the hammering control unit 220 may generate and output a target address T_ADD for selecting the word line. If a row hammering word line is found to be a redundancy word line based on replacement information RED, the hammering control unit 220 may generate and output a target address TR_ADD for selecting the redundancy word line. Furthermore, when a supplemental refresh signal SR is activated, the hammering control unit 220 may output replacement information RED in a supplemental refresh section. The replacement information RED may be deactivated when a row hammering word line is a word line. The replacement information RED may be activated when a row hammering word line is a redundancy word line.

The hammering control unit 220 may generate a target address T_ADD or TR_ADD by adding or subtracting a specific value to or from a hammering address H_ADD stored therein. If a row hammering word line is a word line, the hammering control unit 220 may generate a target address T_ADD by subtracting 1 from a hammering address H_ADD. If a row hammering word line is a redundancy word line, the hammering control unit 220 may generate a target address TR_ADD by adding or subtracting 1 to or from a hammering address H_ADD. If a hammering address H_ADD corresponds to a K-th word line, a value obtained by subtracting 1 from the hammering address H_ADD may correspond to a (K−1)-th word line, and a value obtained by adding 1 to the hammering address H_ADD may correspond to a (K+1)-th word line. If a hammering address H_ADD corresponds to an L-th redundancy word line, a value obtained by subtracting 1 from the hammering address H_ADD may correspond to an (L−1)-th redundancy word line, and a value obtained by adding 1 to the hammering address H_ADD may correspond to an (L+1)-th redundancy word line.

The refresh counter 230 may generate a counting address C_ADD by updating a counter each time a refresh signal REFA is activated. For example, the refresh counter 230 may increase the value of the counting address C_ADD by 1 each time the refresh signal REFA is activated. Hence, if, for example, the value of the counting address C_ADD is increased by 1, this may mean that if a K-th word line has been selected this time, the value of the counting address C_ADD is changed so that a (K+1)-th word line is selected next time. When the supplement refresh signal SR is activated, the refresh counter 230 may not perform a counting operation, i.e., may not change the value of the counting address C_ADD.

When a refresh command REF is applied, the refresh control unit 240 may activate the refresh signal REFA more than once (e.g., twice), count the number of times that the refresh command REF has been applied, and activate the supplement refresh signal SR if a specific condition is met.

When the refresh signal REFA is activated in a state in which the supplement refresh signal SR has been deactivated, a normal refresh operation may be performed. When the refresh signal REFA is activated in a state in which the supplement refresh signal SR has been activated, a supplement refresh operation may be performed. For example, the refresh control unit 240 may activate the supplement refresh signal SR whenever the refresh command REF is applied in a multiple of 8, and deactivate the supplement refresh signal SR after the refresh signal REFA is activated twice after the activation of the supplement refresh signal SR.

The redundancy control unit 250 may store the address of a replaced word line and control the repair operation of the memory device. For example, a repair operation may mean an operation for replacing a defective word line with a redundancy word line and accessing the redundancy word line instead of the defective word line.

The redundancy control unit 250 may include address storage units (not shown in FIG. 2) corresponding to the respective redundancy word lines RWL0-RWLm. The redundancy control unit 250 may generate the hit signal HIT and signals HIT<0:m> corresponding to the respective redundancy word lines RWL0 to RWLm. If there is an address storage unit among the plurality of address storage units in which the same address as the address I_ADD has been stored, the redundancy control unit 250 may activate a hit signal among the signals HIT<0:m> corresponding to such an address storage unit. Furthermore, when one or more of the signals HIT<0:m> are activated, then the redundancy control unit 250 may activate the hit signal HIT.

The redundancy selection unit 260 may be used to select a redundancy word line using addresses R_ADD and TR_ADD regardless of the signals HIT<0:m> generated by the redundancy control unit 250.

During a test operation, the redundancy selection unit 260 may select a redundancy word line using an address R_ADD received from an external device. While a test operation is performed, the test signal TEST may be activated. If replacement information RED indicates that a row hammering word line is a redundancy word line in a supplemental refresh operation, the redundancy selection unit 260 may select a redundancy word line corresponding to a target address TR_ADD.

The cell array 210 may activate a word line corresponding to the address I_ADD when the active command ACT is applied. The cell array 210 may activate a redundancy word line corresponding to a signal that belongs to the signals HIT<0:m> when the hit signal HIT is activated. When a precharge command PRE is applied, the cell array 210 may precharge an activated normal word line or redundancy word line. Furthermore, when a test signal TEST is activated, the cell array 210 may access a redundancy word line corresponding to an address R_ADD.

The cell array 210 may refresh a word line corresponding to a counting address C_ADD when the refresh signal REFA is activated. The cell array 210 may refresh a redundancy word line corresponding to a signal that belongs to the signals HIT<0:m> and that is activated when the hit signal HIT is activated. Furthermore, the cell array 210 may refresh a word line corresponding to a target address T_ADD when the refresh signal REFA is activated, if the supplement refresh signal SR has been activated but may refresh a redundancy word line corresponding to a target address TR_ADD when replacement information RED is activated.

The deterioration of data attributable to a row hammering phenomenon may be prevented by refreshing word lines adjacent to a row hammering word line. If a row hammering word line is a redundancy word line, a method for selecting adjacent redundancy word lines and performing refresh is problematic. The reason for this is that a word line is commonly selected using a corresponding address, but a redundancy word line is selected using the signals HIT<0:m> other than an address. In the memory device of FIG. 2, when a supplement refresh operation is performed, a redundancy word line is selected using a target address TR_ADD so that adjacent redundancy word lines may be selectively refreshed although a row hammering word line is a redundancy word line.

Figure 3:
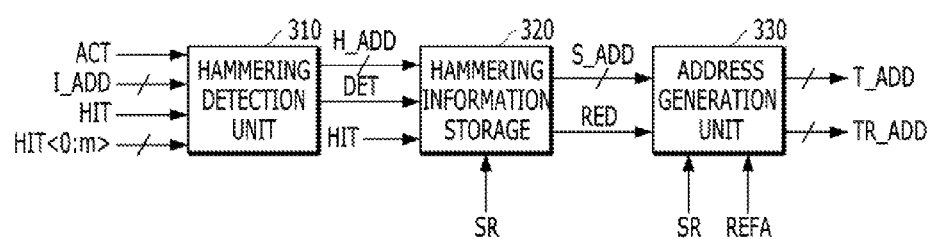
FIG. 3 is a detailed diagram of an example of a hammering control unit shown in FIG. 2.

FIG. 3 is a detailed diagram of an example of the hammering control unit 220 shown in FIG. 2.

Referring to FIG. 3, the hammering control unit 220 may include a hammering detection unit 310, a hammering information storage unit 320, and an address generation unit 330.

The hammering detection unit 310 may detect a row hammering word line and output the address of a row hammering word line as a hammering address H_ADD. The hammering detection unit 310 may detect a row hammering word line in response to the active command ACT, the address I_ADD, the hit signal HIT, and the signals HIT<0:m>. The hammering detection unit 310 may detect a row hammering word line using the input number of the address I_ADD, inputted along with the active command ACT, or input frequency of the address I_ADD inputted along with the active command ACT. For example, if the input number of the address I_ADD corresponding to the word line WLk, which is inputted along with the active command ACT, is equal to or greater than the reference number, or if the input frequency of the address I_ADD inputted along with the active command ACT is equal to or greater than the reference number, the hammering detection unit 310 may output the address I_ADD corresponding to the word line WLk as a hammering address H_ADD. The hammering detection unit 310 may activate a detection signal DET when detecting a row hammering word line.

In this case, if the row hammering word line is a redundancy word line, the hammering detection unit 310 may output an address corresponding to an activated signal of the signals HIT<0:m> as the hammering address H_ADD. For example, if the activation number of the signal HIT<1> activated along with the active command ACT is equal to or greater than the reference number, the hammering detection unit 310 may output an address corresponding to the redundancy word line RWLl corresponding to the signal HIT<l> as a hammering address H_ADD.

When the detection signal DET is activated, the hammering information storage unit 320 may store a hammering address H_ADD and the hit signal HIT. The hit signal HIT may be stored as replacement information RED indicative of whether a row hammering word line is a normal word line or a redundancy word line. If the hit signal HIT has been deactivated when the detection signal DET is activated, a row hammering word line may be a word line. If the hit signal HIT has been activated when the detection signal DET is activated, a row hammering word line may be a redundancy word line. The hammering information storage unit 320 may sequentially store two or more addresses and replacement information if the detection signal DET is activated more than twice.

The hammering information storage unit 320 may output an address S_ADD and replacement information RED stored in a supplemental refresh operation. If the number of stored addresses and stored replacement information is equal or greater than two, the hammering information storage unit 320 may sequentially output the stored addresses and stored replacement information. For example, if first and second addresses and first and second replacement information are to be stored, the hammering information storage unit 320 may output the first address and the first replacement information in a first supplemental refresh operation, and output the second address and the second replacement information in a second supplemental refresh operation.

The address generation unit 330 may generate a target address T_ADD or TR_ADD using an address S_ADD output by the hammering information storage unit 320. For example, the address generation unit 330 may generate a target address T_ADD by subtracting 1 from an address S_ADD when replacement information RED is deactivated and the supplement refresh signal SR is activated. The address generation unit 330 may generate a target address T_ADD by adding 1 to an address S_ADD when the refresh signal REFA is activated after the supplement refresh signal SR is activated. The address generation unit 330 may generate a target address T_ADD by subtracting 1 from an address S_ADD when replacement information RED is activated and the supplement refresh signal SR is activated. The address generation unit 330 may generate a target address T_ADD by adding 1 to an address S_ADD when the refresh signal REFA is activated and deactivated after the supplement refresh signal SR is activated. The sequence in which 1 is added to or subtracted from the address S_ADD may be reversed.

FIG. 4 is a detailed diagram of an example of the hammering information storage unit 320 shown in FIG. 3.

Referring to FIG. 4, the hammering information storage unit 320 may include a selection signal generation unit 410, a plurality of address storage units 420_0 to 420_3, and a plurality of replacement information storage units 430_0 to 430_3.

The selection signal generation unit 410 may activate first selection signals SEL1<0:3> sequentially, based on the activation number of the detection signal DET. The selection signal generation unit 410 may activate second selection signals SEL2<0:3> sequentially, based on the activation number of the supplement refresh signal SR. The selection signal generation unit 410 may activate the first selection signals SEL1<0> to SEL1<3> sequentially, when the detection signal DET is activated from first to fourth. Furthermore, the selection signal generation unit 410 may activate the second selection signals SEL2<0> to SEL2<3> sequentially, when the supplement refresh signal SR is activated from first to fourth.

Each of the plurality of address storage units 420_0 to 420_3 may store a hammering address H_ADD when the detection signal DET is activated and each of the first selection signals SEL1<0:3> is activated. Each of the plurality of address storage units 420_0 to 420_3 may output an address S_ADD therein when the supplement refresh signal SR is activated and each of the second selection signals SEL2<0:3> is activated.

Each of the plurality of replacement information storage units 430_0 to 430_3 may store the hit signal HIT as replacement information when the detection signal DET is activated and each of the first selection signals SEL1<0:3> is activated. Each of the plurality of replacement information storage units 430_0 to 430_3 may output replacement information RED stored therein when the supplement refresh signal SR is activated and each of the second selection signals SEL2<0:3> is activated.

FIG. 5 is a detailed diagram of the redundancy control unit 250 shown in FIG. 2.

Referring to FIG. 5, the redundancy control unit 250 may include a plurality of address storage units 510_0 to 510_*m*, a plurality of comparison units 520_0 to 520_*m*, and a signal generation unit 530. The plurality of address storage units 510_0 to 510_*m* corresponds to the respective redundancy word lines RWL0-RWLm, and store the addresses of the word lines WL0 to WLn to be replaced. For example, if the word line WL13 is replaced with the redundancy word line RWL3, the address of the word line WL13 may be stored in the address storage unit 510_3.

The plurality of comparison units 520_0 to 520_*m* corresponds to the respective address storage units 510_0 to 510_*m*, compare the address I_ADD with addresses S_ADD0 to S_ADDm stored in the corresponding address storage units 510_0 to 510_*m*, and generate the signals HIT<0:m> based on the results of the comparison. If the address I_ADD is the same as each of the addresses S_ADD0 to S_ADDm stored in the corresponding address storage units 510_0 to 510_*m*, each of the comparison units 520_0 to 520_*m* may activate each of the signals HIT<0:m>.

The signal generation unit 530 generates the hit signal HIT, activate the hit signal HIT when one or more of the signals HIT<0:m> are activated, and deactivate the hit signal HIT when all of the signals HIT<0:m> are deactivated.

Figure 6:
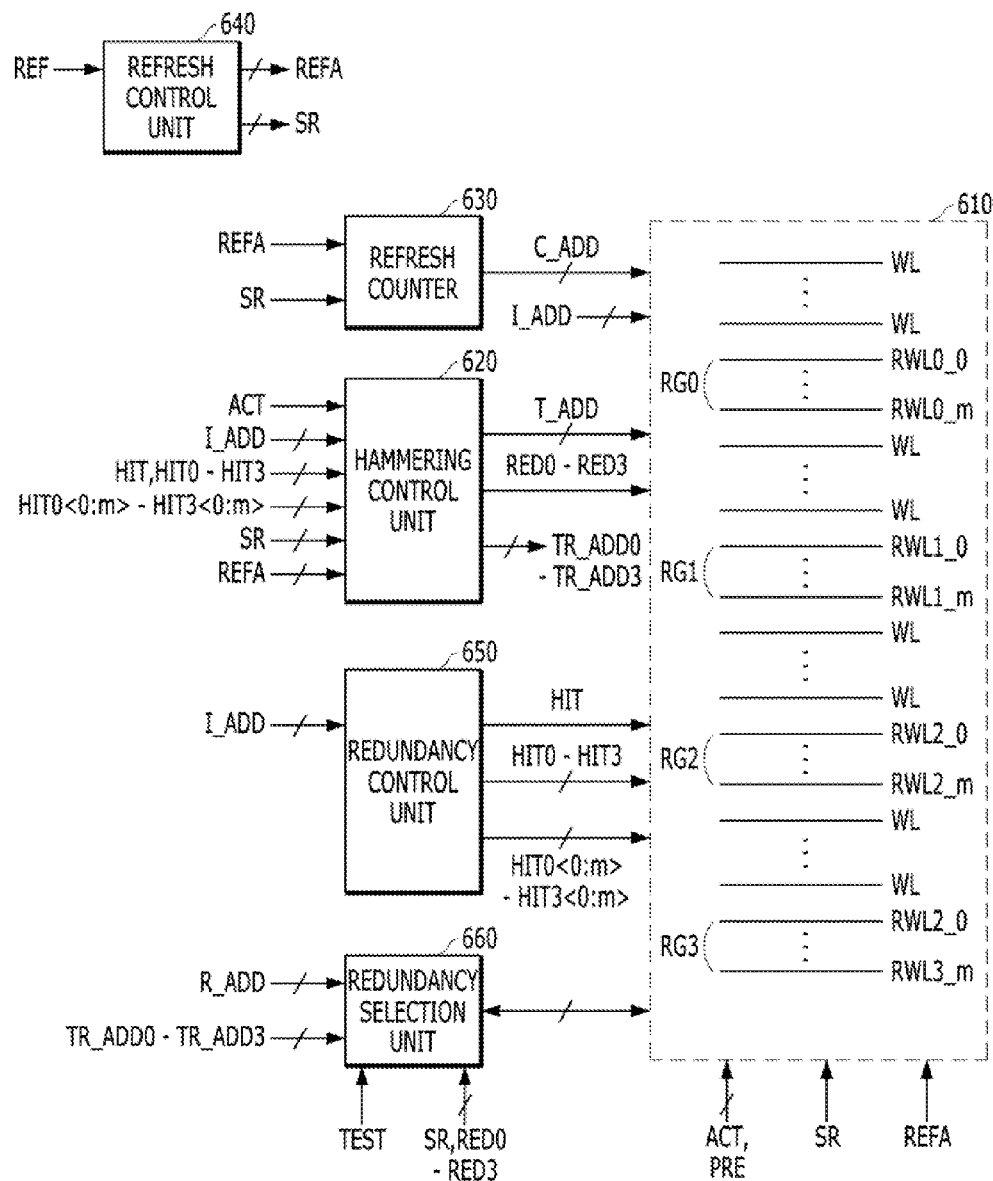
FIG. 6 is a diagram illustrating a memory device according to another embodiment of the present invention.

FIG. 6 is a block diagram illustrating a memory device according to an embodiment of the present invention.

Referring to FIG. 6, the memory device may include a cell array 610, a hammering control unit 620, a refresh counter 630, a refresh control unit 640, a redundancy control unit 650, and a redundancy selection unit 660.

In the memory device of FIG. 6, the cell array 610 may include a plurality of redundancy groups RG0 to RG3 including one or more redundancy word lines RWL0_0 to RWL0_*m* to RWL3_0 to RWL3_*m*, respectively, along with a plurality of word lines WL (bit lines and memory cells are not shown. The memory device shown in FIG. 6 may perform an operation similar to the memory device shown in FIG. 2 except that it includes the plurality of redundancy groups RG0 to RG3.

Figure 7:
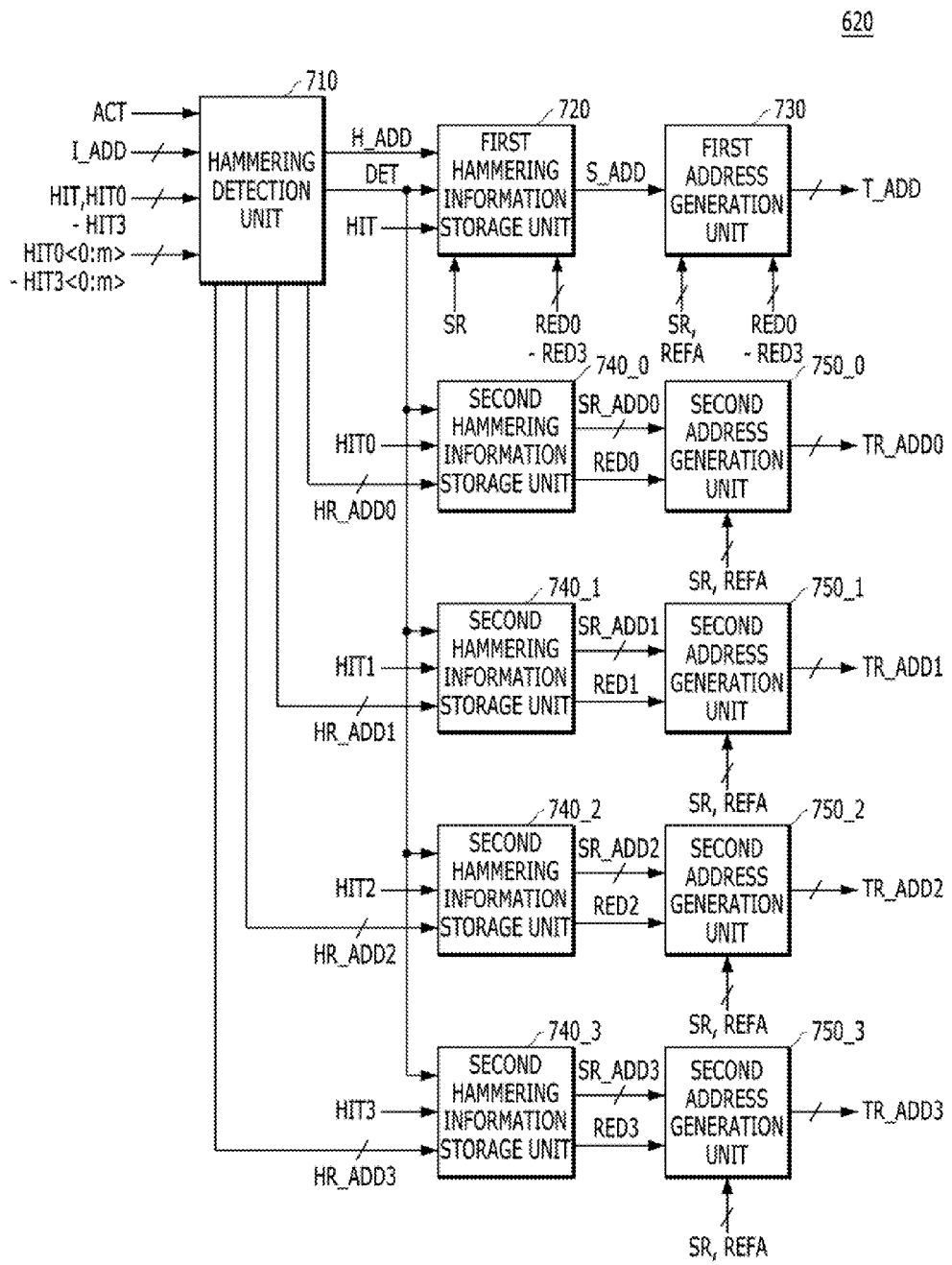
FIG. 7 is a detailed diagram of an example of a hammering control unit shown in FIG. 6.

FIG. 7 is a detailed diagram of the hammering control unit 620 shown in FIG. 7.

Referring to FIG. 7, the hammering control unit 620 may include a hammering detection unit 710, a first hammering information storage unit 720, a first address generation unit 730, a plurality of second hammering information storage units 740_0 to 740_3, and a plurality of second address generation units 750_0 to 750_3.

The hammering detection unit 710 may detect a row hammering word line and output the address of a row hammering word line as a hammering address H_ADD, HR_ADD0 to HR_ADD3. The hammering detection unit 710 may detect a row hammering word line in response to an active command ACT, an address I_ADD, a hit signal HIT, HIT0 to HIT3, and a signal HIT0<0:m> to HIT3<0:m>. The hit signals HIT0 to HIT3 correspond to the respective redundancy groups RG0 to RG3, and the signals HIT0<0:m> to HIT3<0:m> correspond to the redundancy word lines RWL0_0 to RWL0_$m$ to RWL3_0 to RWL3_$m$, respectively. A method of detecting, by the hammering detection unit 710, a row hammering word line is similar to the method described with reference to FIG. 3. The hit signal HIT may be activated when one or more of the hit signals HIT0 to HIT3 are activated.

For reference, when one or more of the signals HIT0<0:m> are activated, the hit signal HIT0 may be activated. When one or more of the signals HIT1<0:m> are activated, the hit signal HIT1 may be activated. When one or more of the signals HIT2<0:m> are activated, the hit signal HIT2 may be activated. When one or more of the signals HIT3<0:m> are activated, the hit signal HIT3 may be activated.

When detecting a row hammering word line, the hammering detection unit 710 may activate a detection signal DET and output a hammering address H_ADD, HR_ADD0 to HR_ADD3. If a row hammering word line is a word line, the hammering detection unit 710 may output the address I_ADD as a hammering address H_ADD.

If a row hammering word line is a redundancy word line, the hammering detection unit 710 may output an address, corresponding to an activated signal of the signals HIT0<0:m> to HIT3<0:m>, as one of the hammering addresses HR_ADD0 to HR_ADD3 corresponding to an activated hit signal of the hit signals HIT0 to HIT3. When one of the signals HIT0<0:m> and the hit signal HIT0 are activated, the hammering detection unit 710 may output an address, corresponding to the activated signal (i.e., one of the signals HIT0<0:m>), as the hammering address HR_ADD0. When one of the signals HIT1<0:m> and the signal HIT1 are activated, the hammering detection unit 710 may output an address, corresponding to the activated signal (i.e., one of the signals HIT1<0:m>), as the hammering address HR_ADD1. When one of the signals HIT2<0:m> and the signal HIT2 are activated, the hammering detection unit 710 may output an address, corresponding to the activated signal (i.e., one of the signals HIT2<0:m>), as the hammering address HR_ADD2. When one of the signals HIT3<0:m> and the hit signal HIT3 are activated, the hammering detection unit 710 may output an address, corresponding to the activated signal (i.e., one of the signals HIT3<0:m>), as the hammering address HR_ADD3.

When the detection signal DET is activated, the first hammering information storage unit 720 may store a hammering address H_ADD. When the detection signal DET is activated more than twice, the first hammering information storage unit 720 may sequentially store two or more addresses and replacement information. When all pieces of replacement information RED0 to RED3 are deactivated in a supplemental refresh operation, the first hammering information storage unit 720 may output an address S_ADD stored therein.

The first address generation unit 730 may generate a target address T_ADD using an address S_ADD output by the first hammering information storage unit 720. When all pieces of replacement information RED0 to RED3 are deactivated and a supplement refresh signal SR is activated, the first address generation unit 730 may generate a target address T_ADD by subtracting 1 from an address S_ADD. When a refresh signal REFA is activated and deactivated after the supplement refresh signal SR is activated, the first address generation unit 730 may generate a target address T_ADD by adding 1 to the address S_ADD. In this case, the sequence in which 1 is subtracted from the address S_ADD and the sequence in which 1 is added to the address S_ADD may be reversed.

Each of the plurality of second hammering information storage units 740_0 to 740_3 may store each of the hammering addresses HR_ADD0 to HR_ADD3 when the detection signal DET and each of the hit signals HIT0 to HIT3 are activated. When the detection signal DET and each of the hit signals HIT0 to HIT3 are activated more than twice, each of the second hammering information storage units 740_0 to 740_3 may store two or more addresses and replacement information sequentially.

When a corresponding hit signal is activated in a supplemental refresh operation, each of the second hammering information storage units 740_0 to 740_3 may output each of the addresses SR_ADD0 to SR_ADD3 and each of the pieces of replacement information RED0 to RED3 stored therein. If the number of stored addresses and the number of pieces of stored replacement information are two or more, each of the second hammering information storage units 740_0 to 740_3 may sequentially output the stored addresses and the pieces of stored replacement information.

When each of the pieces of replacement information RED0 to RED3 output by each of the second hammering information storage units 740_0 to 740_3 is activated, each of the second address generation units 750_0 to 750_3 may generate each of the target addresses TR_ADD0 to TR_ADD3 using each of the addresses SR_ADD0 to SR_ADD3 output by each of the second hammering information storage units 740_0 to 740_3. For example, when the replacement information RED0 is activated and the supplement refresh signal SR is activated, the second address generation unit 750_0 may generate the target address TR_ADD0 by subtracting 1 from the address SR_ADD0. When the refresh signal REFA is activated and deactivated after the supplement refresh signal SR is activated, the second address generation unit 750_0 may generate the target address TR_ADD0 by adding 1 to the address SR_ADD0. In this case, the sequence in which 1 is subtracted from the address SR_ADD0 and the sequence in which 1 is added to the address SR_ADD0 may be reversed. Furthermore, the remaining second address generation units 750_1 to 750_3 may operate in the same manner.

For reference, although not shown in FIGS. 6 and 7, the second hammering information storage units 740_0 to 740_3 and the second address generation units 750_0 to 750_3 may be disposed adjacent to corresponding redundancy groups RG0 to RG3. That is, the second hammering information storage unit 740_0 and the second address generation unit 750_0 may be disposed adjacent to the redundancy group RG0. The second hammering information storage unit 740_1 and the second address generation unit 750_1 may be disposed adjacent to the redundancy group RG1. The second hammering information storage unit 740_2 and the second address generation unit 750_2 may be disposed adjacent to the redundancy group RG2. The second hammering information storage unit 740_3 and the second address generation unit 750_3 may be disposed adjacent to the redundancy group RG3.

Each of the cell arrays 210 and 610 shown in FIGS. 2 and 6 may further include circuits for accessing the word lines and the bit lines in response to a plurality of control signals in addition to the word lines, the redundancy word lines, the bit lines, and the memory cells.

In the embodiments of the present invention, although a row hammering phenomenon is generated, the memory device may normally operate because data stored in the memory device is prevented from being damaged by additionally refreshing a word line adjacent to a row hammering word line.

In the embodiments of the present invention, if a row hammering word line is a redundancy word line, although a row hammering phenomenon is generated in a redundancy word line, the memory device may normally operate because data stored in the memory device is prevented from being damaged by additionally refreshing a redundancy word line adjacent to the row hammering word line.

Although various embodiments have been described for illustrative purposes, it will be apparent to those skilled in the art after having read the present disclosure that various changes and modifications may be made without departing from the spirit and scope of the invention as defined in the following claims.

What is claimed is:

1. A memory device, comprising:
   a plurality of normal word lines;
   a plurality of redundancy word lines capable of replacing the word lines;
   a hammering information storage unit capable of storing an address of a row hammering word line of the normal word lines and the redundancy word lines;
   an address generation unit capable of generating an address of a normal word line or redundancy word line adjacent to a normal word line or redundancy word line corresponding to the address stored in the hammering information storage unit; and
   a refresh control unit capable of selecting the normal word line or redundancy word line corresponding to the address generated by the address generation unit for performing an additional refresh operation.

2. The memory device of claim 1, wherein the row hammering word line comprises a word line or a redundancy word line having an activated number equal to or greater than a reference number or having an activated frequency equal to or greater than a reference frequency.

3. The memory device of claim 1, wherein the hammering information storage unit stores replacement information indicative of whether the row hammering word line is a normal word line or a redundancy word line.

4. The memory device of claim 1, wherein the address generation unit is capable of generating the address of the normal word line or redundancy word line adjacent to the normal word line or redundancy word line corresponding to the address stored in the hammering information storage unit by adding or subtracting a specific value to or from the address stored in the hammering information storage unit.

5. The memory device of claim 1, wherein the refresh control unit is controls the normal word lines in response to a periodically received refresh command to be sequentially refreshed,
   wherein the refresh control unit controls the normal word line or redundancy word line corresponding to the address generated by the address generation unit to be additionally refreshed whenever a specific number of the refresh commands are received.

6. The memory device of claim 3, wherein the address generation unit
   generates an address of a normal word line adjacent to the row hammering word line using an address corresponding to the row hammering word line when the replacement information indicates the row hammering word line is a normal word line; or
   generates an address of a redundancy word line adjacent to the row hammering word line using the address of the row hammering word line when the replacement information indicates that the row hammering word line is a redundancy word line.

7. The memory device of claim 6, further comprising a redundancy selection unit capable of controlling a redundancy word line corresponding to the address to be selected when performing a test operation.

8. The memory device of claim 7, wherein the redundancy selection unit controls a redundancy word line corresponding to an address generated by the address generation unit to be selected when the replacement information indicates that the row hammering word line is a redundancy word line.

9. A memory device, comprising:
   a plurality of normal word lines;
   a plurality of redundancy word lines capable of replacing the word lines;
   a hammering address generation unit capable of storing an address of a row hammering word line of the normal word lines and the redundancy word lines and replacement information indicative of whether the row hammering word line is a normal word line or a redundancy word line, and generating an address of a normal word line or redundancy word line adjacent to the row hammering word line;
   a redundancy selection unit capable of controlling the redundancy word line corresponding to the address generated by the hammering address generation unit to be selected from the redundancy word lines when the replacement information indicates that the row hammering word line is the redundancy word line; and
   a refresh control unit capable of controlling the normal word line or redundancy word line corresponding to the address generated by the hammering address generation unit to be additionally refreshed.

10. The memory device of claim 9, wherein the row hammering word line comprises a normal word line or a redundancy word line having an activation number equal or greater than a reference number, or having a frequency equal or greater than a reference frequency.

11. The memory device of claim 9, wherein the hammering address generation unit generates the address of the normal word line or redundancy word line adjacent to the normal word line or redundancy word line corresponding to the address stored in the hammering information storage unit by adding or subtracting a specific value to or from the address stored in the hammering information storage unit.

12. The memory device of claim 9, wherein the refresh control unit controls the normal word lines in response to a periodically received refresh command to be sequentially refreshed, and
   wherein the refresh control unit controls the normal word line or redundancy word line corresponding to the address generated by the address generation unit to be additionally refreshed whenever a specific number of the refresh commands are received.

13. The memory device of claim 9, wherein the redundancy selection unit controls a redundancy word line corresponding to the address to be selected when performing a test operation.

14. A memory device, comprising:
a plurality of normal word lines;
a plurality of redundancy groups each comprising one or more redundancy word lines for replacing the word lines;
a first hammering information storage unit capable of storing an address of a row hammering word line of the normal word lines;
a first address generation unit capable of generating an address of a normal word line adjacent to a normal word line corresponding to the address stored in the first hammering information storage unit;
a plurality of second hammering information storage units each capable of storing an address of a row hammering word line of the redundancy word lines of each of the redundancy groups;
a plurality of second address generation units each capable of generating an address of a redundancy word line adjacent to a redundancy word line corresponding to the address stored in each of the second hammering information storage units; and
a refresh control unit capable of controlling a normal word line corresponding to the address generated by the first address generation unit or a redundancy word line corresponding to the address generated by the second address generation unit to be additionally refreshed.

15. The memory device of claim 14, wherein the row hammering word line comprises a normal word line or a redundancy word line having an activation number equal or greater than a reference number, or having a frequency equal or greater than a reference frequency.

16. The memory device of claim 14, wherein the second hammering information storage unit stores replacement information indicative of whether the row hammering word line is a normal word line or a redundancy word line.

17. The memory device of claim 14, wherein:
the first address generation unit generates the address of the word line adjacent to the word line corresponding to the address stored in the first hammering information storage unit by adding or subtracting a specific value to or from the address stored in the first hammering information storage unit, and
the second address generation unit generates the address of the redundancy word line adjacent to the redundancy word line corresponding to the address stored in the second hammering information storage unit by adding or subtracting a specific value to or from the address stored in the second hammering information storage unit.

18. The memory device of claim 14, wherein the refresh control unit controls the normal word lines in response to a periodically received refresh command to be sequentially refreshed, and
wherein the refresh control unit controls the word line corresponding to the address generated by the first address generation unit or the redundancy word line corresponding to the address generated by the second address generation unit to be additionally refreshed whenever a specific number of the refresh commands are received.

19. The memory device of claim 16, wherein:
the first address generation unit generates the address of the word line adjacent to the row hammering word line using an address corresponding to the row hammering word line when the replacement information indicates the row hammering word line is a normal word line, and
the second address generation unit generates the address of the redundancy word line adjacent to the row hammering word line using the address of the row hammering word line when the replacement information indicates that the row hammering word line is a redundancy word line.

* * * * *